United States Patent
Lin et al.

(10) Patent No.: US 6,316,303 B1
(45) Date of Patent: Nov. 13, 2001

(54) METHOD OF FABRICATING A MOS TRANSISTOR HAVING SEG SILICON

(75) Inventors: Tony Lin, Kaohsiung Hsien; Chien-Chao Huang, Kaohsiung; Ming-Yin Hao, Taipei, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/504,563

(22) Filed: Feb. 15, 2000

(30) Foreign Application Priority Data

Jan. 11, 2000 (TW) .............................. 89100307 A

(51) Int. Cl.[7] ...................... H01L 21/8238; H01L 21/337
(52) U.S. Cl. ...................... 438/222; 438/194; 438/226; 438/231; 438/230
(58) Field of Search ........................... 438/194, 197, 438/211, 217, 222, 226, 230, 231, 199, 302, 305, 299

(56) References Cited

U.S. PATENT DOCUMENTS

| | | | |
|---|---|---|---|
| 5,491,099 | * | 2/1996 | Hsu ....................................... 438/302 |
| 5,583,064 | * | 12/1996 | Lee et al. ............................. 438/300 |
| 5,595,919 | * | 1/1997 | Pan ....................................... 438/302 |
| 5,691,225 | * | 11/1997 | Abiko ................................... 438/199 |
| 5,899,719 | * | 5/1999 | Hong .................................... 438/289 |
| 5,915,182 | * | 6/1999 | Wu ....................................... 438/299 |
| 6,015,753 | * | 1/2000 | Lin et al. ............................. 438/682 |
| 6,083,798 | * | 7/2000 | Lin ....................................... 438/297 |
| 6,104,063 | * | 8/2000 | Fulford, Jr. et al. ................ 257/344 |
| 6,114,209 | * | 9/2000 | Chu et al. ............................ 438/300 |
| 6,184,097 | * | 2/2001 | Yu ........................................ 438/299 |
| 6,228,730 | * | 5/2001 | Chen et al. .......................... 438/301 |
| 6,254,676 | * | 7/2001 | Yang et al. ........................... 117/95 |

FOREIGN PATENT DOCUMENTS

0530046 A1 * 8/1992 (EP) .
WO 98/35380 * 8/1998 (WO) .

* cited by examiner

*Primary Examiner*—Trung Dang
*Assistant Examiner*—Brook Kebede
(74) *Attorney, Agent, or Firm*—Thomas, Kayden, Horstemeyer & Risley

(57) ABSTRACT

A method of fabricating a MOS transistor having SEG Si. After the formation of a gate and a spacer and before a source/drain region is formed, a selective epitaxial growth (SEG) Si is deposited over the substrate. The spacer is then removed to form an ultra shallow junction in the exposed substrate covered by the spacer after the formation of the SEG Si.

15 Claims, 2 Drawing Sheets

METHOD OF FABRICATING A MOS TRANSISTOR HAVING SEG SILICON

CROSS-REFERENCE TO RELATED APPLICATION

This application claims the priority benefit of Taiwan application serial no. 89100307, filed Jan. 11, 2000.

BACKGROUND OF THE INVENTION

1. Field of Invention

The present invention relates to a method of fabricating a metal-oxide-semiconductor (MOS) transistor. More particularly, the present invention relates to a method of fabricating a MOS having selective epitaxial growth (SEG) silicon.

2. Description of Related Art

As the line width of MOS is reduced to or less than 0.1 μm according to the reduced design rule, in order to increase the margin for patterning a contact window, the SEG Si is gradually applied to the process of contact window where the source/drain region is exposed. However, there are still several problems with regard to the SEG Si that need to be overcome.

FIG. 1 is a schematic, cross-sectional view of a MOS having SEG Si. A gate 102 is formed on the substrate 100. The gate 102 is isolated from the substrate 100 by a gate oxide layer 104 and has an insulating spacer 106 formed on its sidewall. A source/drain region 108 is formed in the substrate 100, close to the gate 102, and a lightly doped region 110 is formed in the substrate 100 between the gate 102 and the source/drain region 108. After the formation of the above structure, SEG Si 112a, 112b is then formed on the gate 102 and the source/drain region 108.

Normally, the epitaxial silicon 112a, 112b should grow with the same orientation as that of the substrate 102 when the chemical reactants and the system parameters are controlled well. The epitaxial silicon 112a, 112b, however, becomes a polysilicon layer because of dopants in the source/drain region 108. Polysilicon is silicon composed of many, randomly arranged crystal unit cells, usually leading to a rough surface. Therefore, when the silicide is subsequently formed on SEG Si 112a, 112b, the silicide has an orientation similar to the polysilicon. As a result, the SEG Si 112a, 112b having sharp grains induces current leakage between the silicide and the substrate 100, which is known as the 'dopant effect'. Accordingly, one of the troubles of SEG Si 112a, 112b is that the quality of the SEG Si 112a, 112b is varied with the dopants in the source/drain region 108, as illustrated in FIG. 1. Such phenomenon causes difficulty in the subsequent processes and leads to poor device quality, especially when the SEG Si is formed on a PMOS.

In addition, the SEG Si 112a, 112b grows at a high temperature and is formed after the formation of the lightly doped region 110. Such a high temperature, as is required to form the SEG 112a, 112b, makes the lightly doped region 110 diffuse outwardly so that the channel length becomes shorter when the line width is reduced. As a result, the short channel effect or the hot carrier effect are induced and cause device failure.

SUMMARY OF THE INVENTION

The invention provides a method of fabricating a MOS transistor having SEG Si, thereby eliminating such problems as the dopant effect to improve the performance of the MOS transistor.

As embodied and broadly described herein, the invention provides a method of fabricating a MOS transistor having SEG Si. A gate is formed on a substrate and a spacer is formed on the sidewall of the gate. A SEG Si is formed over the substrate and a source/drain region is then formed in the substrate beside the spacer. The spacer is removed and an ultra shallow junction is formed in the substrate beside the gate.

The source/drain region is formed by a first ion implantation so that the ions penetrate through the SEG Si into the substrate. After removing the spacer, the surface of the substrate adjacent the gate is exposed and a second ion implantation is thus performed to form the ultra shallow junction in the exposed substrate.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

The preferred embodiment of this invention is to form a SEG Si prior to the formation of the source/drain region so that the SEG Si does not have a rough surface thereon due to the dopant effect, and current leakage is therefore avoided. Additionally, the ultra shallow junction is formed after the SEG Si and the diffusion due to the thermal process of forming SEG Si does not happen. Accordingly, the MOS transistor fabricated in this embodiment can prevent the dopant effect or other possible influence on the device as the design rule is reduced.

Figure 1:
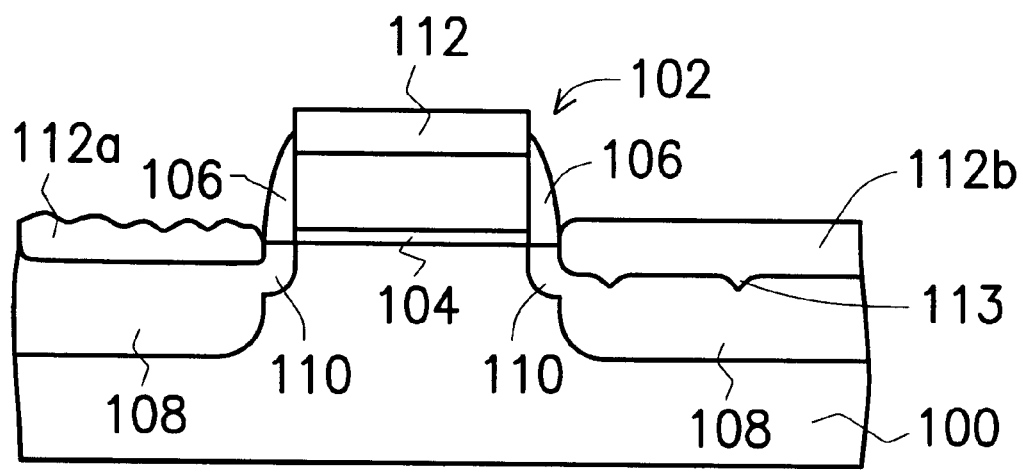
FIG. 1 is a schematic, cross-sectional view of a MOS transistor having SEG Si.
Figure 2A:
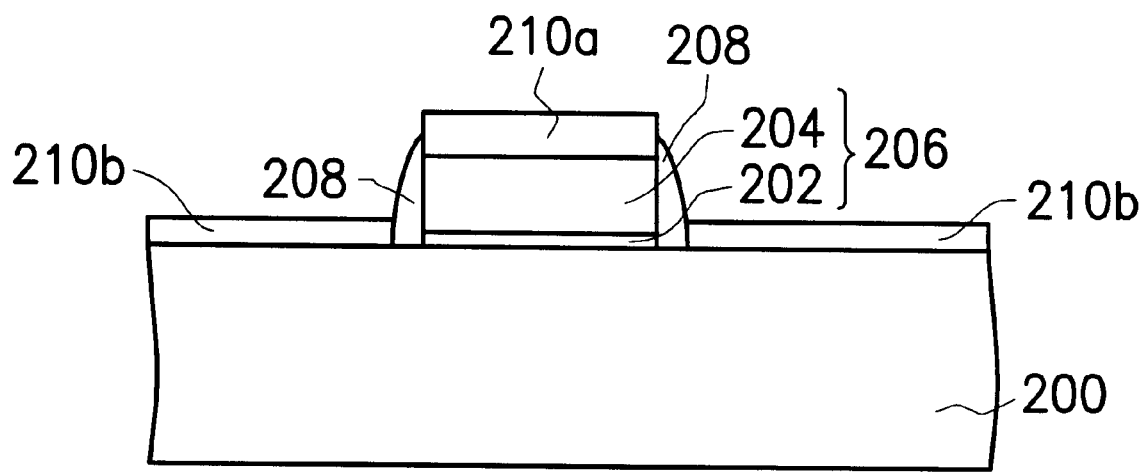
FIGS. 2A–2C are schematic, cross-sectional view illustrating of a method of fabricating a MOS transistor having SEG Si according to one preferred embodiment of this invention.
Figure 2B:
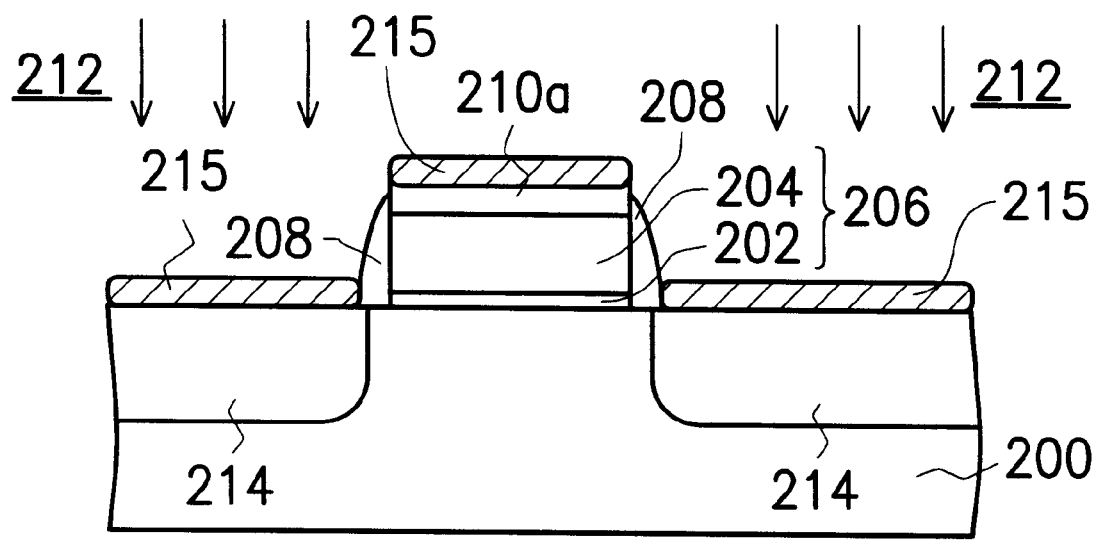
Figure 2C:
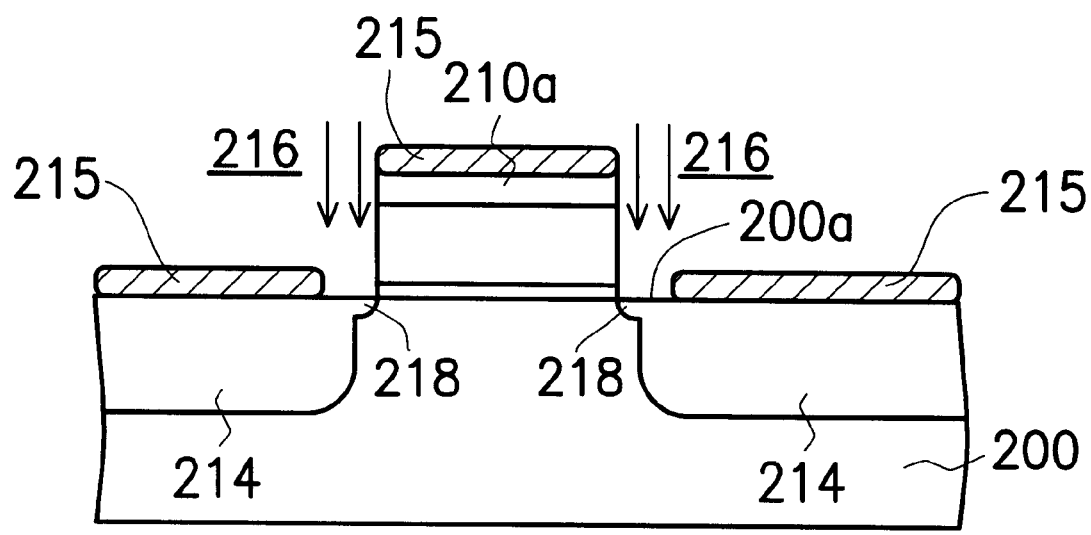

FIGS. 2A–2C are schematic, cross-sectional views illustrating a method of fabricating a MOS transistor having SEG Si. Referring to FIG. 2A, a gate oxide layer 202 is formed on a substrate 200 by thermal oxidation, for example. The substrate 200 is formed of semiconductor materials such as silicon. A conductive layer 204 serving as a gate can be a doped polysilicon layer and is formed by chemical vapor deposition (CVD), for example. The conductive layer 204 can also be made of a structure such as metal silicide/polysilicon. The gate oxide layer 202 isolates the substrate 200 from the conductive layer 204.

As shown in FIG. 2A, the conductive layer 204 and the gate oxide layer 202 are patterned by photolithography to form a gate 206. Thereafter, an insulating layer is formed by CVD over the substrate 200, where the insulating layer can be silicon oxide, silicon nitride or different materials from the gate 206 and the substrate 200. The insulating layer is then anisotropically etched back so that a spacer 208 is formed on the sidewall of the gate 206 to protect the gate 206.

A SEG Si 210a, 210b is then formed by CVD, where the reactant gases including $CH_2Cl_2$, $H_2$, Si, and HCl flow in, the chamber pressure is maintained at about 15 torr and the temperature is maintained in the range of about 800–850° C., for example. Under these conditions, the SEG Si can be selectively deposited on surfaces having silicon formed thereon. Accordingly, the exposed surface of the substrate 200 and the gate 206 made of polysilicon have SEG Si 210a, 210b formed thereon and the SEG Si has the same crystal orientation as the underlying silicon. The SEG Si 210a, 210b in this embodiment are formed on the substrate 200 beside the spacer 206 and the gate 206.

Referring to FIG. 2B, a first ion implantation 212 is performed on the substrate 200 and the implanted ions 212 include boron(B), for example, for a PMOS. Since the substrate 200 beside the spacer 208 is covered by the SEG Si 210b, the source/drain region 214 is formed by the implanted ions penetrating the SEG Si 210b into the substrate 200. Thereafter, a metal silicide layer 215 such as titanium silicide can be formed on the SEG Si 210b.

As shown in FIG. 2C, the spacer 208 is removed by wet etching. For example, when the spacer 208 is made of silicon nitride, the nitride spacer can be removed by hot phosphoric acid. Accordingly, the surface of the substrate 200 adjacent to the gate 200a is exposed; that is, the surface 200a of the substrate 200 covered by the spacer 208 is exposed. After the removal of the spacer 208, a second ion implantation 216 is carried out to form an ultra shallow junction 218 in the exposed substrate 200a where the ions include $B_2^+$, for example, for PMOS.

Since the above described structure is exposed to the high temperature required to form the SEG Si 210a, 210b prior to the formation of the source/drain region 214, the dopant effect induced by the dopant in the source/drain region 214 can be eliminated when the SEG Si 210a, 210b grows. In another aspect, the ultra shallow junction 218 is form ed after the SEG Si 210a, 210b is deposited such that the outward diffusion of the ultra shallow junction 218 due to thermal process of SEG Si 210a, 210b can be prevented.

The preferred embodiment of the invention is first to form a SEG Si in a pre-determined position for the source/drain region on the substrate after the formation of the gate and the spacer. Thereafter, the source/drain region is formed by ion implantation in the substrate under the pre-determined position. The spacer is then removed and an ultra shallow junction is formed in the exposed substrate after removal of the spacer.

The SEG Si is formed before the formation of the source/drain region such that the SEG Si can be high in quality. Additionally, the ultra shallow junction is formed after forming the SEG Si so that the diffusion of the ultra shallow junction due to the thermal process is avoided and the problems caused by a reduced channel are overcome. Therefore, the performance of the MOS device is enhanced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following, claims and their equivalents.

What is claimed is:

1. A method of fabricating a MOS transistor having selective epitaxial growth (SEG) Si formed on a substrate, the method comprising:

forming a gate on the substrate and forming a spacer on a sidewall of the gate;

forming a selective epitaxial growth (SEG) Si on the gate and the substrate beside the spacer;

forming a source/drain region in the substrate beside the spacer;

removing the spacer for exposing a portion of the substrate adjacent to the gate; and forming an ultra shallow junction in the exposed portion of the substrate.

2. The method according to claim 1, wherein a gate oxide layer is further formed between the gate and the substrate.

3. The method according to claim 1, wherein the spacer includes insulating materials.

4. The method according to claim 1, wherein the source drain region is formed by an ion implantation where the ions penetrate the selective epitaxial growth (SEG) Si into the substrate.

5. The method according to claim 1, wherein the spacer is removed by wet etching.

6. The method according to claim 1, wherein the ultra shallow junction is formed by ion implantation.

7. A method of fabricating a MOS transistor having selective epitaxial growth (SEG) Si, the method comprising:

providing a substrate;

forming a gate on the substrate and forming an insulating spacer on a sidewall of the gate;

forming a selective epitaxial growth (SEG) Si on the substrate beside the insulating spacer to cover exposed substrate;

performing a first ion implantation on the substrate to form a source/drain region in the substrate under the selective epitaxial growth (SEG) Si;

removing the insulating spacer so that a surface of the substrate adjacent to the gate is exposed; and performing a second ion implantation on the exposed substrate to form an ultra shallow junction.

8. The method according to claim 7, wherein the insulating spacer includes insulating materials.

9. The method according to claim 7, wherein the selective epitaxial growth (SEG) Si is further formed on the gate.

10. The method according to claim 7, wherein the selective epitaxial growth (SEG) Si is formed by reactants including $CH_2Cl_2$, $H_2$, Si, and HCl.

11. The method according to claim 7, wherein the selective epitaxial growth (SEG) Si is formed at a temperature in the range of about 800–850☐ and under a pressure of about 15 torr.

12. The method according to claim 7, wherein the ions of the first ion implantation penetrate through the selective epitaxial growth (SEG) Si into the substrate.

13. The method according to claim 7, wherein the insulating spacer is removed by wet etching.

14. The method according to claim 7, wherein a metal silicide is further formed on the selective epitaxial growth (SEG) Si after formation of the source/drain region.

15. A method of fabricating a MOS transistor having selective epitaxial growth (SEG) Si, the method comprising:

providing a substrate;

forming a gate on the substrate and forming an insulating spacer on a sidewall of the gate;

forming a selective epitaxial growth (SEG) Si only on the gate and the substrate beside the insulating spacer;

performing a first ion implantation on the substrate to form a source/drain region in the substrate under the selective epitaxial growth (SEG) Si;

removing the insulating spacer so that a portion of the substrate adjacent to the gate is exposed; and performing a second ion implantation to form an ultra shallow junction in the exposed portion of the substrate after the step of removing the insulating spacer.

* * * * *